United States Patent
Xu et al.

(10) Patent No.: US 8,697,189 B2
(45) Date of Patent: Apr. 15, 2014

(54) METHOD AND APPARATUS FOR PRECISION SURFACE MODIFICATION IN NANO-IMPRINT LITHOGRAPHY

(75) Inventors: Ren Xu, San Jose, CA (US); Carl T. Petersen, III, Fremont, CA (US); Charles Liu, Los Altos, CA (US)

(73) Assignee: Intevac, Inc., Santa Clara, CA (US)

( * ) Notice: Subject to any disclaimer, the term of this patent is extended or adjusted under 35 U.S.C. 154(b) by 1223 days.

(21) Appl. No.: 12/572,224

(22) Filed: Oct. 1, 2009

(65) Prior Publication Data

US 2010/0098862 A1    Apr. 22, 2010

Related U.S. Application Data

(60) Provisional application No. 61/107,265, filed on Oct. 21, 2008.

(51) Int. Cl.
    *C23C 16/00*    (2006.01)
(52) U.S. Cl.
    USPC .......... 427/299; 427/248.1; 118/715
(58) Field of Classification Search
    None
    See application file for complete search history.

(56) References Cited

U.S. PATENT DOCUMENTS 5,126,027 A * 6/1992 Kudo et al. ............ 204/192.13
5,215,420 A * 6/1993 Hughes et al. ............ 414/217
2001/0051081 A1 * 12/2001 Wagner et al. ............ 414/217
2003/0209389 A1 * 11/2003 Buitron et al. ............ 184/6
2008/0075854 A1 * 3/2008 Stirniman et al. ......... 427/248.1

FOREIGN PATENT DOCUMENTS

| CN | 1479277 A | 3/2004 |
|---|---|---|
| CN | 1798862 A | 7/2006 |
| CN | 101916037 A | 12/2010 |
| JP | 2010-118136 A | 5/2010 |
| KR | 2010-0044121 A | 4/2010 |

OTHER PUBLICATIONS

Chinese Office Action in Chinese Application No. 200910179464.2, mailed on Jun. 4, 2012.
Chinese Office Action in Chinese Application No. 200910179464.2, mailed on Dec. 25, 2012.
Third Office Action for Chinese Patent Application No. 200910179464.2, mailed on May 23, 2013.
Fourth Office Action for Chinese Patent Application No. 200910179464.2, mailed on Aug. 20, 2013.

* cited by examiner

*Primary Examiner* — Joseph Miller, Jr.
(74) *Attorney, Agent, or Firm* — Nixon Peabody LLP; Joseph Bach, Esq.

(57) ABSTRACT

A scalable, high-throughput nanoimprint lithography priming tool includes a dual-reactant chemical vapor deposition reactor chamber, a mandrel configured to hold a plurality of hard disks at an inner diameter of the hard disks, and a transport mechanism to move the plurality of hard disks into and out of the chamber. The tool may also include a transfer tool to transfer the plurality of hard disks to additional chambers for processing.

14 Claims, 15 Drawing Sheets

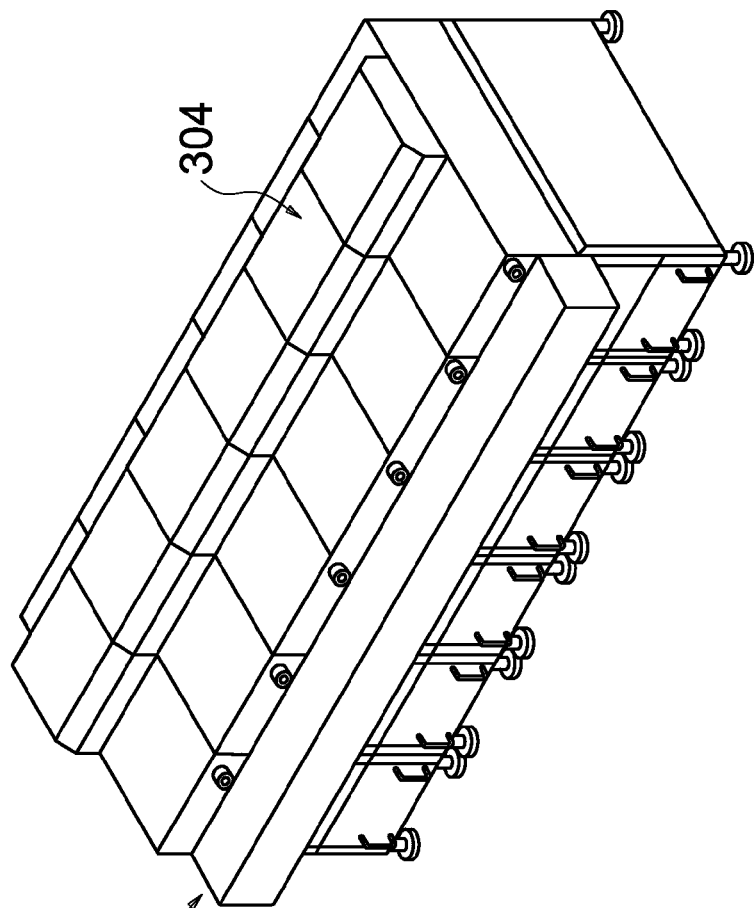
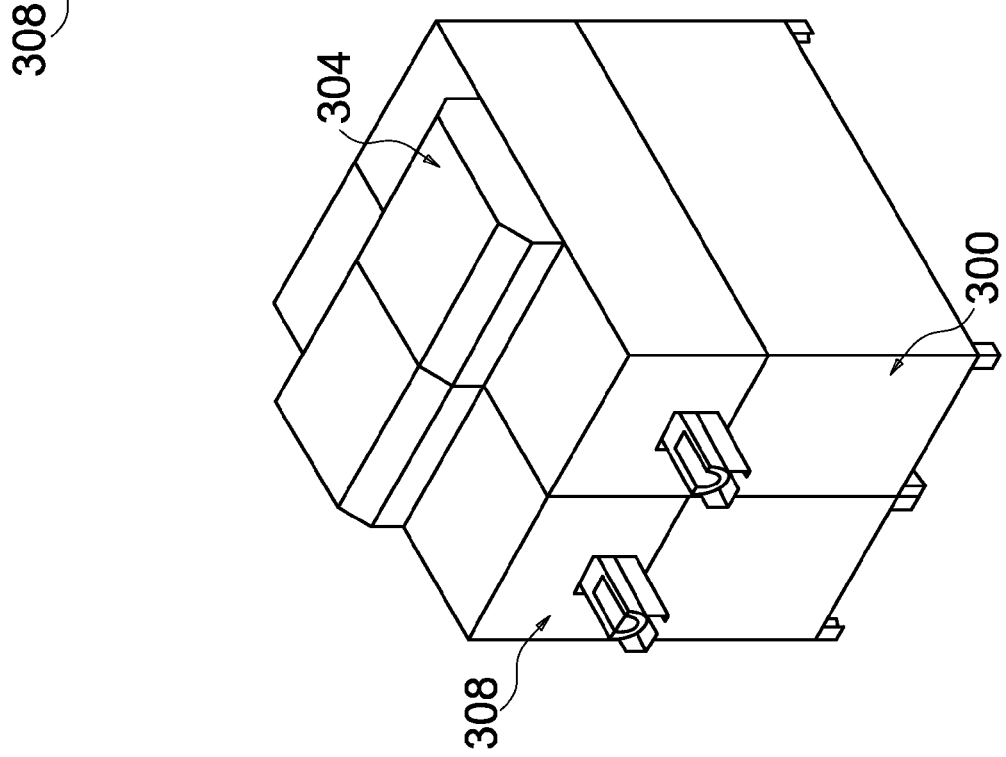

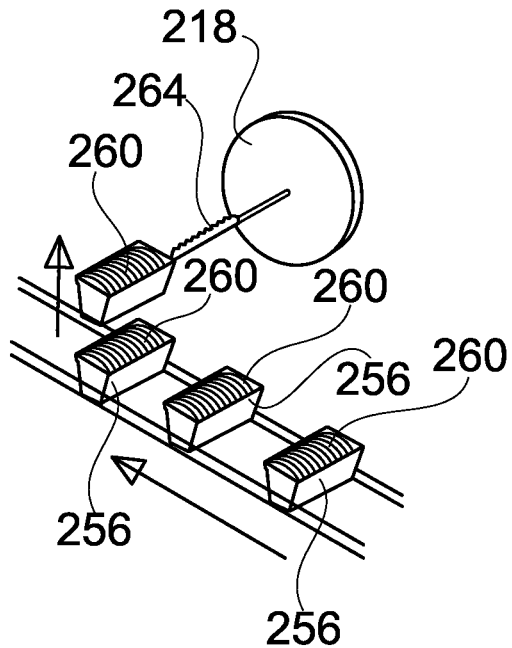
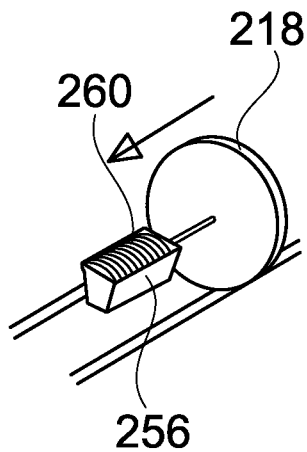
Fig. 4A
Fig. 4B
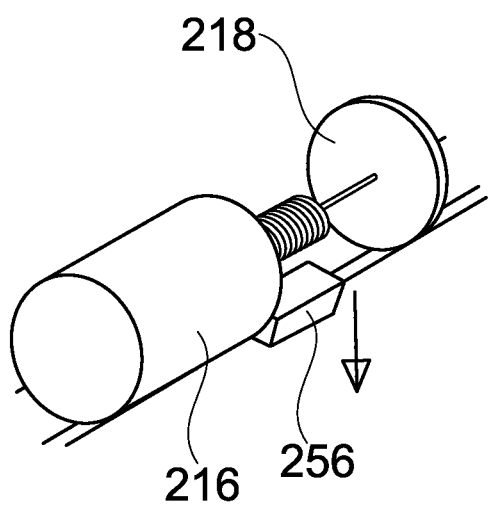
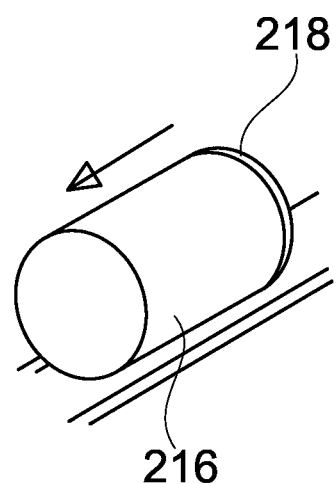
Fig. 4C
Fig. 4D

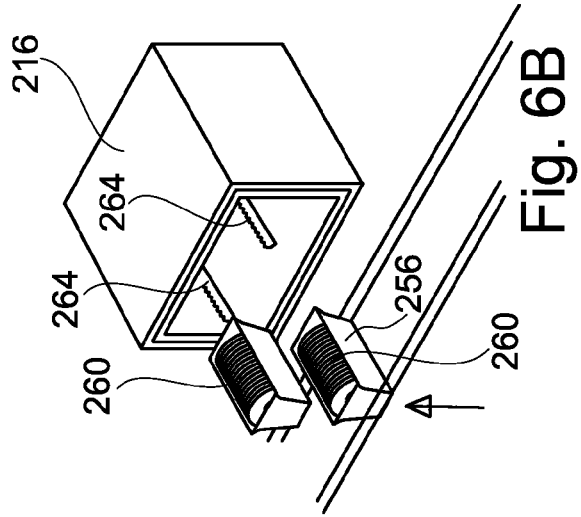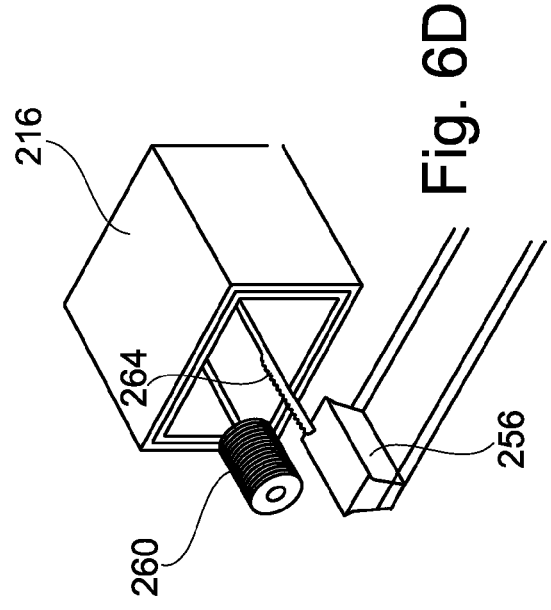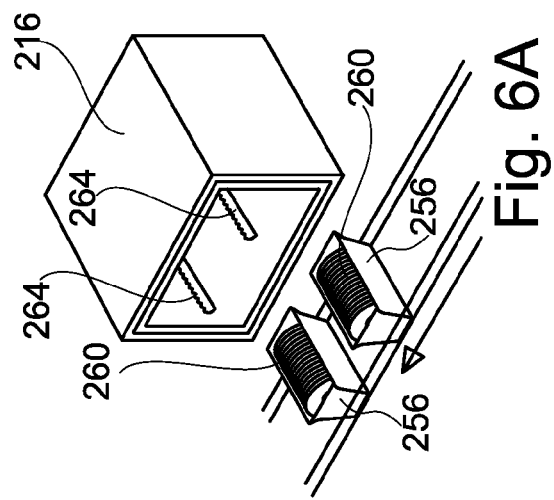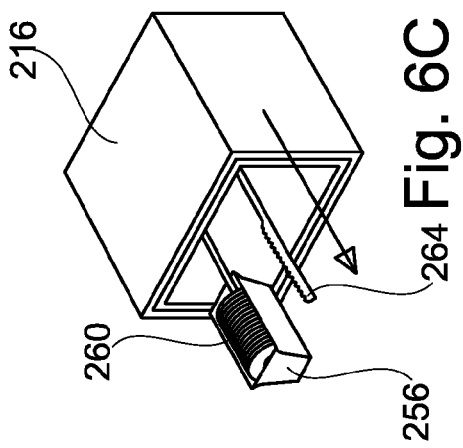

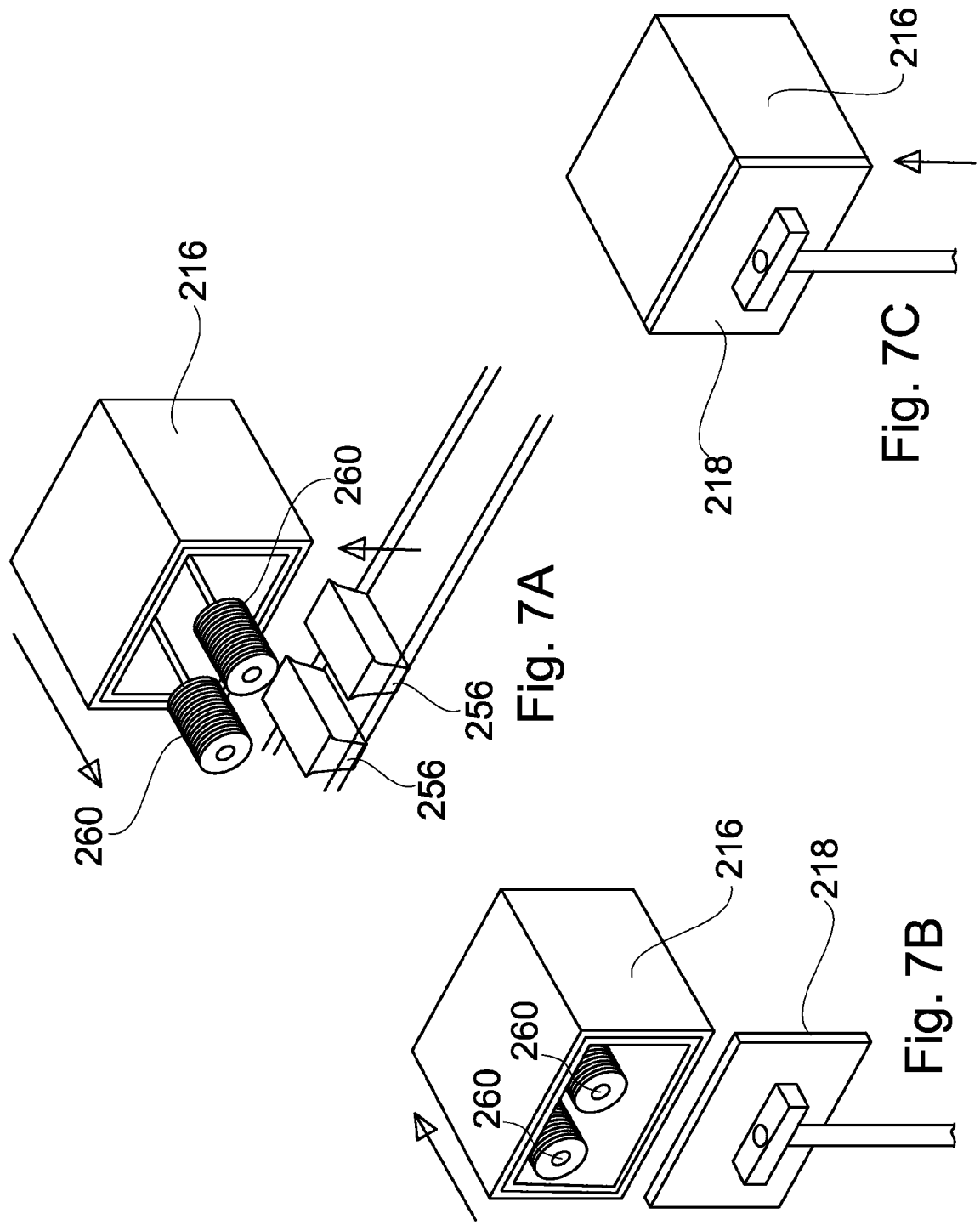

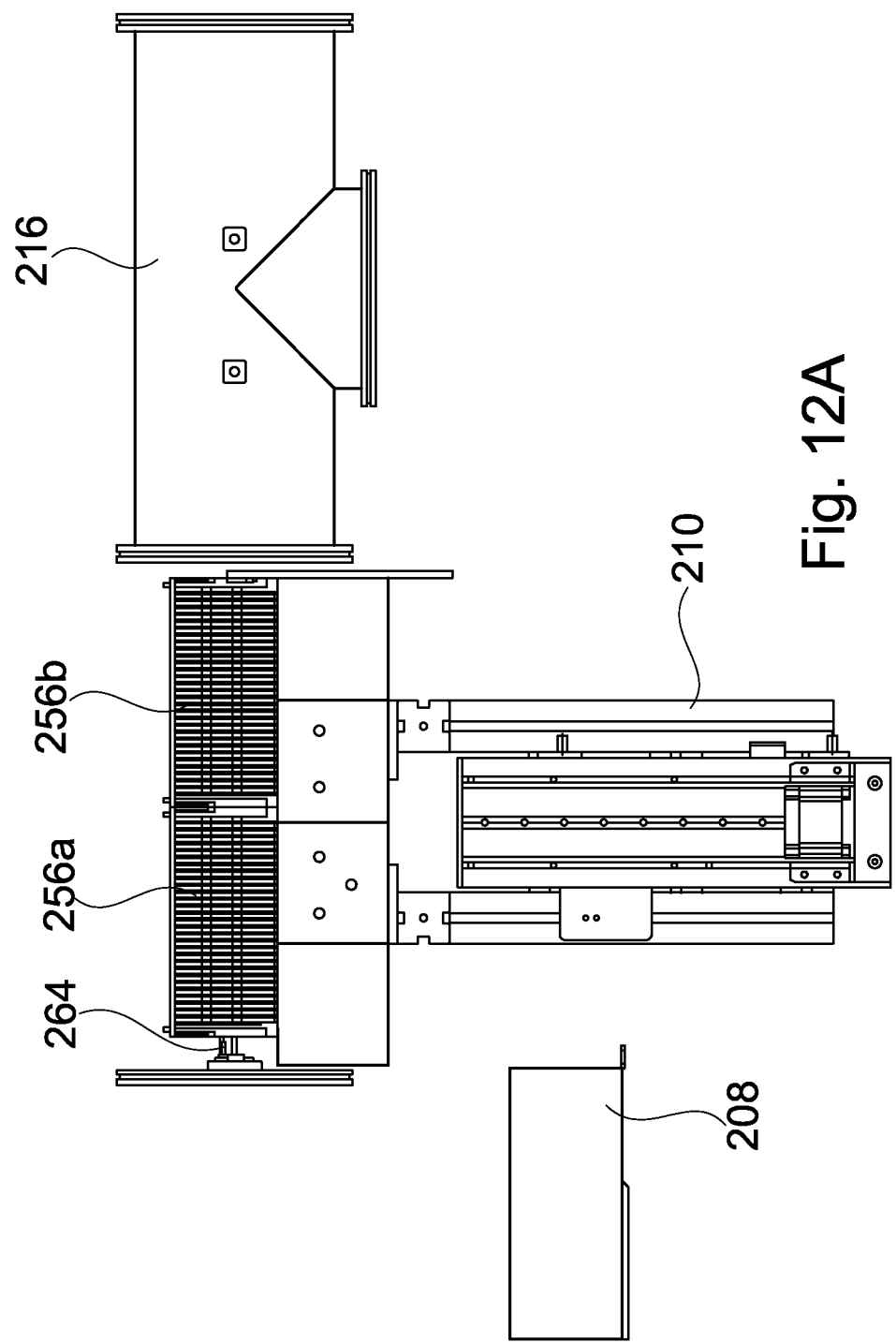

METHOD AND APPARATUS FOR PRECISION SURFACE MODIFICATION IN NANO-IMPRINT LITHOGRAPHY

PRIORITY

The present application claims priority to U.S. Provisional Application No. 61/107,265, filed Oct. 21, 2008, and entitled "METHOD AND APPARATUS FOR PRECISION SURFACE MODIFICATION IN NANO-IMPRINT LITHOGRAPHY," the entirety of which is hereby incorporated by reference.

BACKGROUND

1. Field

This invention relates to the art of substrates, e.g., disk, micro-fabrication and, more particularly, to patterning of substrates, e.g., the magnetic layers of a hard disk for hard disk drives.

2. Related Art

Micro-fabrication of substrates is a well known art employed in, for example, fabrication of semiconductors, flat panel displays, light emitting diodes (LED's), hard disks for hard disk drives (HDD), etc. As is well known, fabrication of semiconductors, flat panel displays and LED's involves various steps for patterning the substrate. On the other hand, traditional fabrication of hard disks, generally referred to as longitudinal recording technology, does not involve patterning. Similarly, fabrication of disks for perpendicular recording technology does not involve patterning. Rather uniform layers are deposited and memory cells are generally defined by the alternating change of magnetic flux induced by the recording head, with each recording bit encompassing multiple grains within the unpatterned magnetic layers.

It has been demonstrated that non-patterned disks would fail to satisfy the needs of the market (e.g., bit density and costs) to remain competitive with other forms of storage. Consequently, it has been proposed that next generation disks should be patterned. It is envisioned that the patterning process may utilize photolithography, although currently there is no certainty which lithography technology may be commercialized, and no commercial system is yet available for commercial manufacturing of patterned media. Among contenders for photolithography are interference photolithography, near field lithography and nano-imprint lithography (NIL). Regardless of the lithography technology utilized, once the photoresist is exposed and developed, the disk needs to be etched and fabricated according to the desired pattern. However, to date much of the development efforts has been focused on the patterning step and no technology has been proposed for fabricating a patterned disk in a commercially viable environment.

To be sure, etch, sputtering, and other fabrication technologies are well known and well developed for semiconductor, flat panel display, LED's, etc. However, no system has been proposed for integrating these technology to enable fabrication of disks for HDD. Moreover, unlike HDD disks, in all of these other applications only one side of the substrate needs to be etched—allowing a chuck to hold the substrate from the backside during fabrication. On the other hand, HDD disks need to be fabricated on both sides, preventing the use of a chuck. Indeed, in HDD disk fabrication no part of the fabrication system may contact any surface of the disk. Also, while HDD manufacturers expect the system to have a throughput on the order of 1000 disks per hour, fabricators of semiconductors employ systems having throughputs of only tens of substrates per hour.

In view of the above, a method and system are required to enable fabrication of hard disks to provide patterned media for HDD.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, a nanoimprint lithography priming tool is provided that includes a dual-reactant chemical vapor deposition reactor chamber; a mandrel configured to hold a plurality of hard disks at an inner diameter of the hard disks; and a transport mechanism to move the plurality of hard disks into the chamber.

The mandrel may be movable outside of the chamber for loading the hard disks and inside the chamber for processing.

The chamber may be configured to operate at a first pressure regime and a second pressure regime. The system may be further be configured to operate at more than two pressure regimes sequentially.

The first pressure regime may be a low vacuum steady flow reaction and wherein the second pressure regime is a high vacuum closed system reaction.

The tool may further include a pump coupled to the chamber and a molecular sieve filter for removal of reactants/products before reaching a pumping manifold coupled to the pump.

The mandrel may be configured to transfer the plurality of disks from a cassette. The tool may further include a mandrel configured to transfer the plurality of disks from more than one cassette.

The tool may further include a plurality of chambers linearly aligned and configured to parallel process a plurality of hard disks on a plurality of mandrels.

The tool may further include a plurality of mandrels configured to simultaneously transport a plurality of hard disks into the chamber for simultaneous processing of the plurality of hard disks in the chamber.

The transport mechanism may include a linear drive to transfer the mandrel linearly; a cassette conveyor to transfer the cassette or cassettes linearly; and a lift to lift the cassette or cassettes from the cassette conveyor to a loading level that allows the mandrel to engage the plurality of disks.

According to another aspect of the invention, a hard disk fabrication system is described that includes an enclosure; a chamber in the enclosure; a transport system to transfer a cassette containing a plurality of hard disks into and within the enclosure; and a mandrel configured to transfer the plurality of hard disks from the cassette or cassettes and into the chamber.

The hard disk fabrication system may also include a second chamber in the enclosure, and the transport system may be further configured to transfer the cassette from the chamber to the second chamber.

The transport mechanism may include a linear drive to transfer the mandrel linearly; a cassette conveyor to transfer the cassette or plurality of cassettes linearly; and a lift to lift the cassette or plurality of cassettes from the cassette conveyor to a loading level that allows the mandrel to engage the plurality of disks.

The chamber may include a vacuum pump configured to establish a first pressure regime and a second pressure regime in the chamber. The chamber may further be configured to establish multiple pressure regimes in the chamber.

The hard disk fabrication system may also include a plurality of mandrels, at least two of the plurality of mandrels configured to be processed in the chamber at the same time.

The hard disk fabrication system may also include a plurality of chambers, the mandrel transferable among each of the plurality of chambers.

At least one of the plurality of chambers may include a first reactant vapor deposition chamber and at least one of the plurality of chambers may include a second reactant vapor deposition chamber.

According to a further aspect of the invention, a method is provided that includes transporting a plurality of hard disks in a cassette or plurality of cassettes; transferring the plurality of hard disks from the cassette or plurality of cassettes to a mandrel; and transferring the mandrel with the plurality of hard disks into a process chamber.

The mandrel may be configured to hold the plurality of hard disks at the inner diameter of the hard disks.

The method may also include depositing a first reactant on the plurality of hard disks; and depositing a second reactant on the plurality of hard disks.

The method may also include operating the process chamber at a first pressure regime to clean the plurality of hard disks before deposition of the first and second reactants; and operating the process chamber at a second pressure regime during the deposition of the first and second reactants.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 3A-B illustrate multiple modules with an enclosure according to one embodiment of the invention;

FIGS. 4A-4D are perspective views illustrating transport of disks from a cassette to a process chamber according to one embodiment of the invention;

FIGS. 6A-6D illustrate disk transfer to a chamber according to one embodiment of the invention;

FIGS. 7A-7C are perspective views of mandrel motion in the nanolithography priming system according to one embodiment of the invention;

FIGS. 12A-12C illustrate disk transfer to a chamber according to one embodiment of the invention.

DETAILED DESCRIPTION

Figure 1:
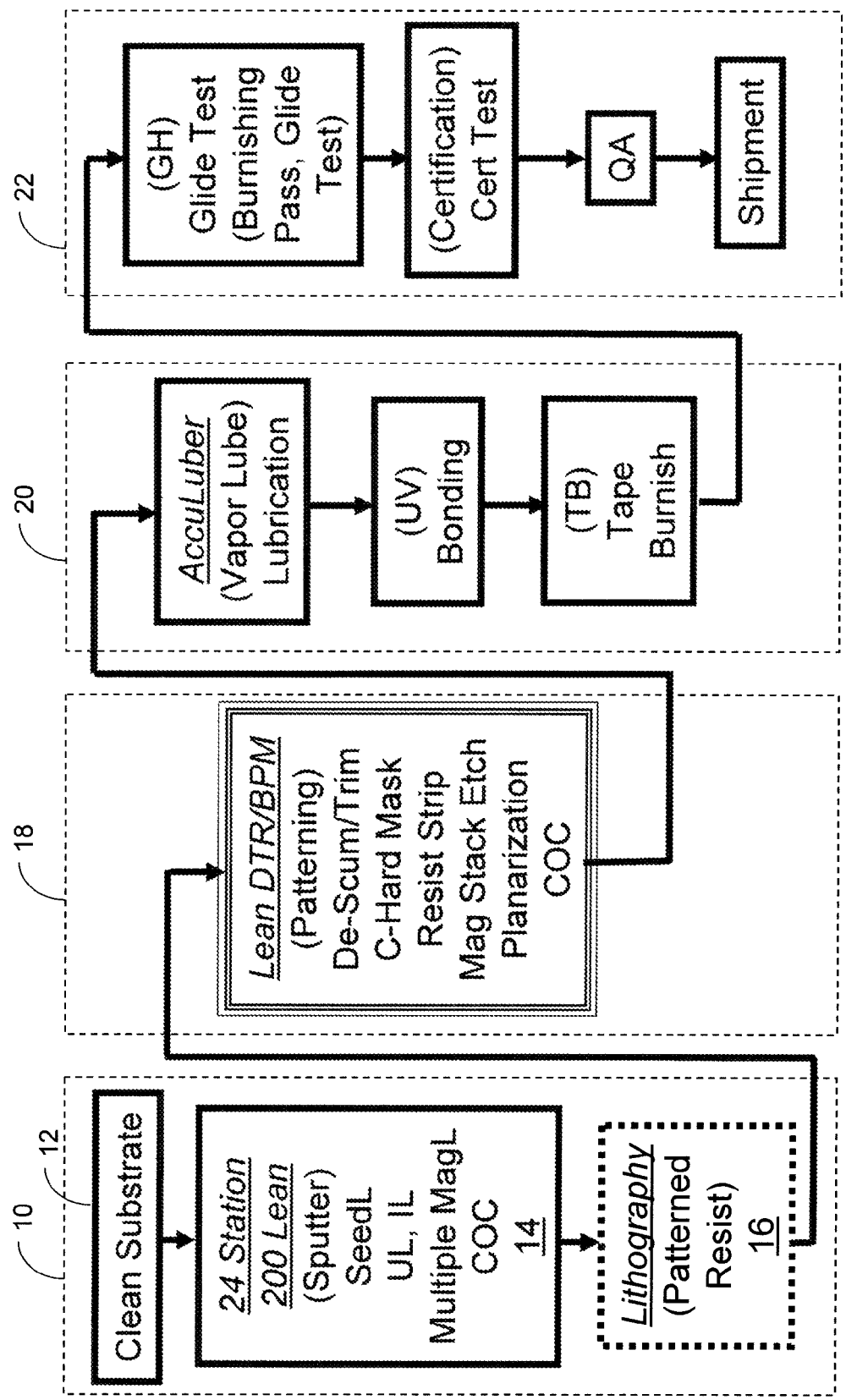
FIG. 1 is a flow chart illustrating a complete process for fabricating HDD patterned media disks according to one embodiment of the invention.

According to embodiments of the invention, system and methods are provided for fabricating patterned media disks. FIG. 1 illustrates a flow chart of a complete process for fabricating HDD patterned media disks, generally divided into four modules (indicated by light broken-line boxes). In FIG. 1, solid-line boxes indicate utilization of conventional continuous media fabrication equipment, the broken-line box indicates utilization of lithography equipment, such as, e.g., nanoimprint lithography (i.e., nanolithography), and the double-line box indicates utilization of patterned media fabrication equipment. In module 10, fabrication starts by cleaning the disks in a cleaning apparatus 12. The disks are then moved to a conventional processing system 14, such as the 200 Lean® for fabricating non-patterned magnetic layers. Thereafter, the disks are moved to a lithography module 16 to imprint the patterning. The lithography module 16 performs nanolithography. Generally, in the lithography module the disk is coated with a photoresist, the photoresist is "exposed" to the required pattern (either by radiation or physical contact with a master, i.e., imprinted), then the exposed resist is developed or cured under UV irradiation. Once the lithography processing is completed, the disk is transferred to the patterning system 18.

In the patterning system 18 various processing steps are performed, which may include de-scum, resist trim, hard mask deposition and etch, resist strip, metal etching, planarization (which may include carbon or metal or oxide refill and etch-back). These processes are performed in a plurality of chambers, each having an independent vacuum environment; however, once the disk enters system 18 it never leaves the vacuum environment until processing is completed. Once processing in the patterning system 18 is completed, the disks are moved to modules 20 and 22, which are not relevant to the subject disclosure.

A critical step during the nanoimprinting process is deposition of a "sticky" layer or primer layer. The key process requirements include vaporization of a first precursor and reaction of the first precursor with a second precursor, e.g., water vapor, to form a monolayer of material through a "self-limiting" reaction. Applicants have developed a nanoimprint tool to facilitate such a reaction of the precursors on a disk, in high vacuum and at high throughput.

Some advantageous features of the nanoimprint priming tool described herein include, for example, batch disk transport, batch disk transfer, and batch vapor deposition. Additional advantageous features of the nanoimprint priming tool include, for example, low vacuum steady flow reaction and a high vacuum closed system reaction in the chamber, precision liquid injection and evaporation-delivery to the closed chamber, heated transport line and chamber for prevention of condensation, shielded chamber for removal of reaction products from the chamber, and molecular sieve filter for removal of reactants/products before reaching a pumping manifold. These features and others will now be described in further detail with reference to FIGS. 2A-8.

FIGS. 2A-2F illustrate the interior of the nanoimprint priming tool 200 and FIGS. 3A-3B illustrate the exterior of the nanoimprint priming tool 200. FIGS. 3A-3B also illustrate that multiple nanoimprint priming tools 200 may be provided next to one another in the system to parallel process multiple batches of disks.

Figure 2B:
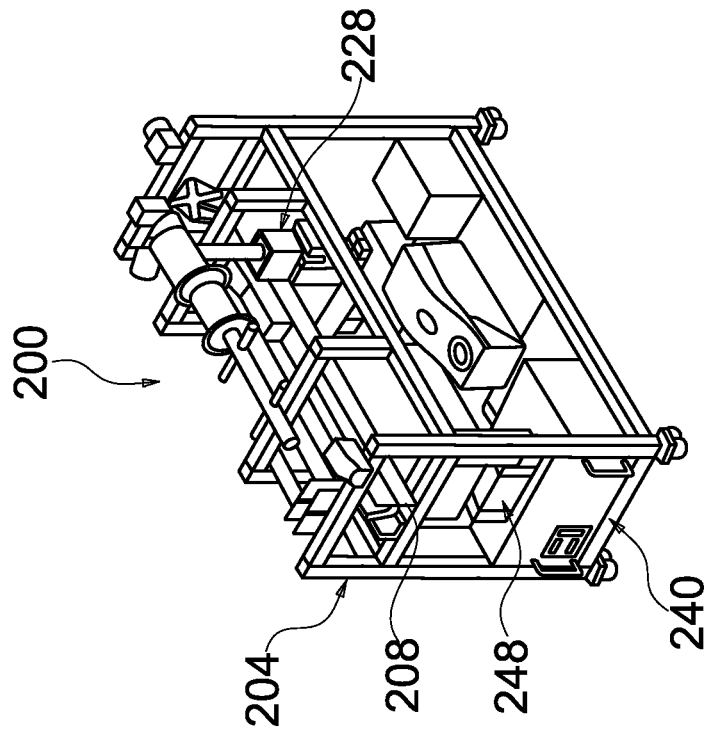
FIGS. 2A-2F illustrate a module of the nanolithography priming module according to one embodiment of the invention.
Figure 2A:
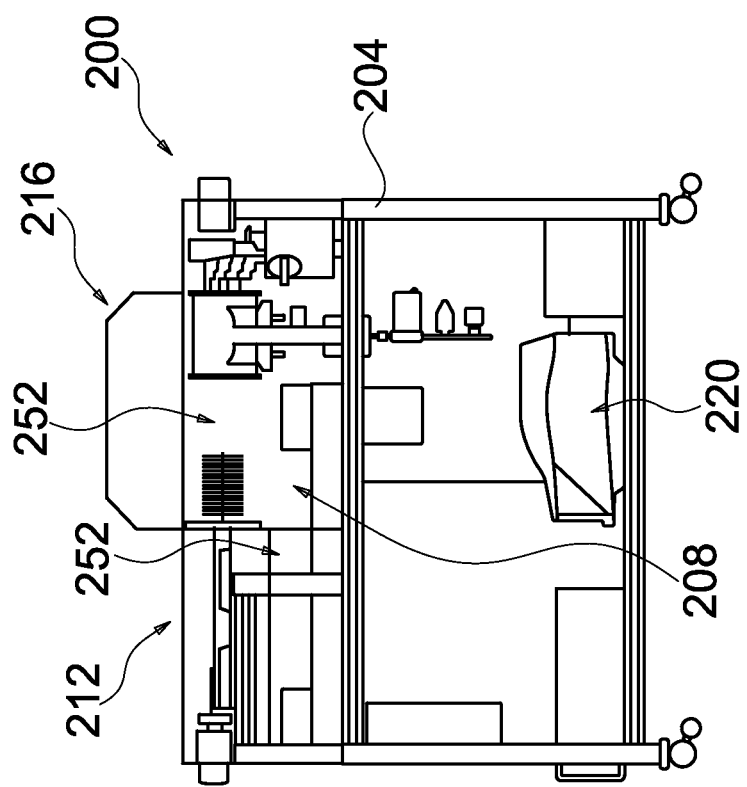
Figure 2D:
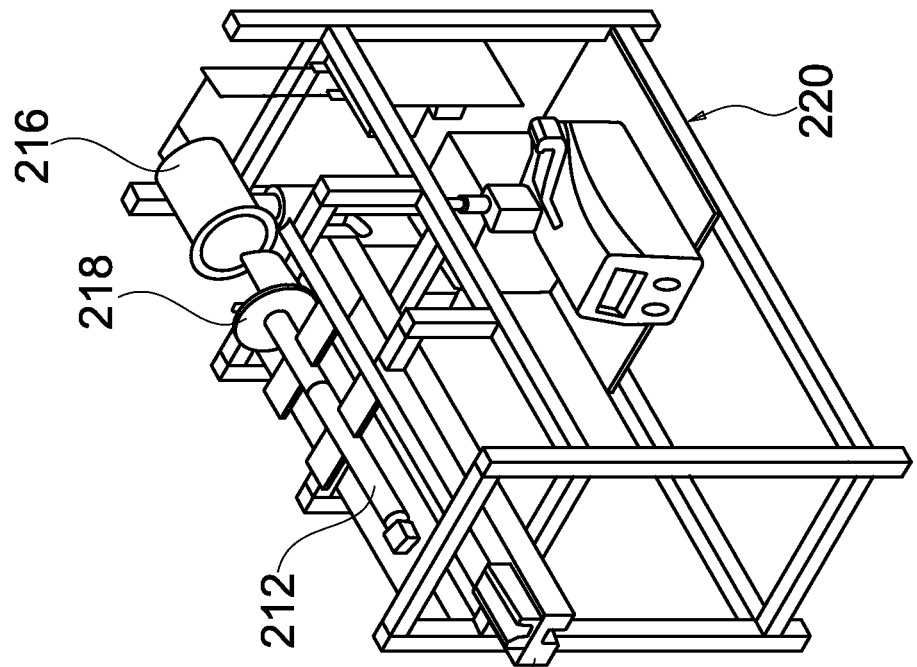
Figure 2C:
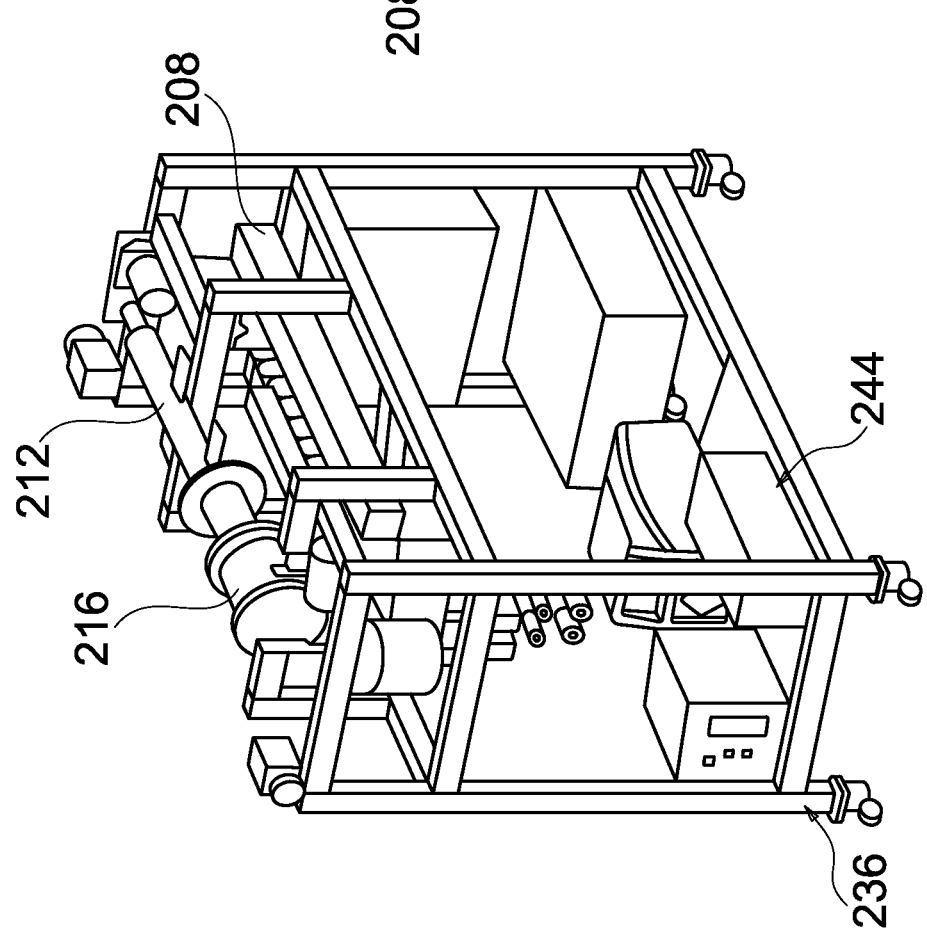
Figure 2F:
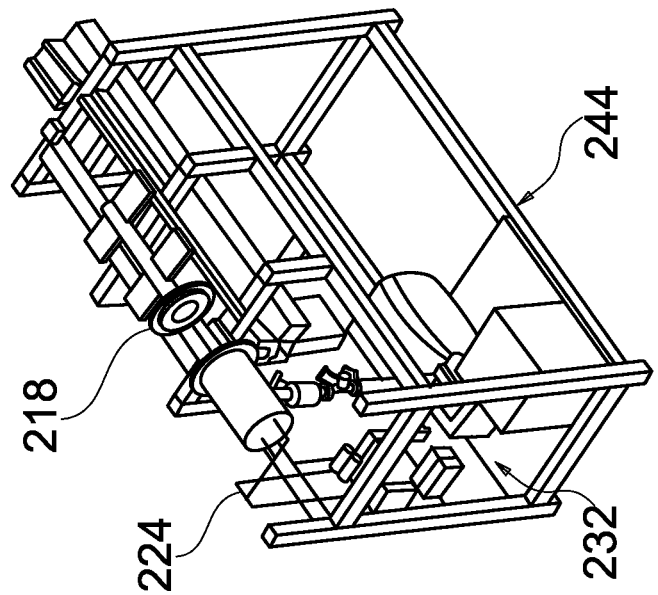
Figure 2E:
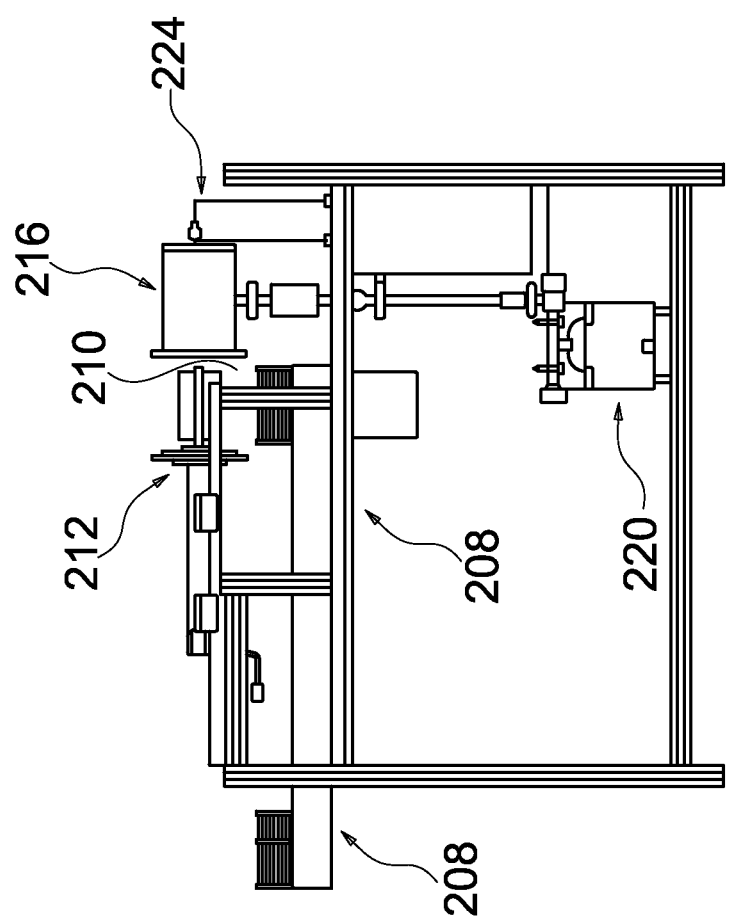

As shown in FIGS. 2A-2F, the nanoimprint priming tool 200 includes a rack mount 204, cassette conveyor 208, disk lift 210, door/mandrel linear drive 212, process chamber 216, vacuum pump 220, delivery lines 224, vapor controllers 228, gas panel 232, power distribution unit (PDU) 236, controller 240, ozone generator 244 and input output (IO) module/motor driver 248. As shown in FIGS. 3A-3B, the nanoimprint priming tool 200 may also include an enclosure 300 and an optional Hepa filter 304 that is communication with a HEPA environment 252 within the nanoimprint tool 200 (FIG. 2A). It will be appreciated that the arrangement of the components of the nanolithography priming tool 200 may vary from that shown in FIGS. 2A-2F. In addition, the nanolithography priming tool 200 may include additional components or fewer components.

Referring back to FIGS. 2A-2F, the rack mount 204 provides a frame on which are mounted the cassette conveyor 208, disk lift 210, door/mandrel linear drive 212, process chamber 216, vacuum pump 220, gas panel 232, PDU 236, controller 240, ozone generator 244 and JO module/motor driver 248.

The cassette conveyor 208 and disk lift 210 are configured to transport one or more cassettes 256. Each cassette 256 is configured to hold a plurality of disks 260 and, in particular embodiment, is configured to hold about twenty-five disks 260. It will be appreciated that the cassette 256 may hold any number of disks 260 including less than or more than twenty-five disks 260. The transport of the disks 260 via the cassettes 256 is automated to support high process throughput. As shown in FIG. 3A, the cassettes 256 are loaded into the nanoimprint priming tool at the cassette load feature of the cassette conveyor 208 through an opening 304 in the enclosure 300. The cassette conveyor 208 is configured to linearly move the cassette 256. In addition, the cassette conveyor 208 and/or disk lift 210 may be equipped with laser sensor cassette positioning to accurately transport the cassette 256 from the opening 304 to the chamber 216.

Once the cassette 256 is transported from the opening 304 to a lift position near the chamber 216 on the cassette conveyor 208, the cassettes 256 can then be lifted to the process chamber 216 using the cassette lift 210. The process chamber 216 includes a door 218 that is coupled to a mandrel 264. The door 218 and mandrel 264 are also coupled to the door/mandrel linear drive 212. The mandrel 264 is configured to transport the disks 260 from the cassette 256 and into the chamber 216. The mandrel 264 holds the disks 260 at the inner diameter of the disks 260. Because the mandrel 264 holds the disks 260 at their inner diameter, particle generation is minimized at contact areas so that particles are only generated at non-critical areas (e.g., the chamfer of the disk at the inner diameter). In one particular embodiment, the mandrel 264 is configured to hold twenty-five disks. It will be appreciated that the mandrel 264 may hold any number of disks, including fewer than twenty-five disks and more than twenty-five disks. The linear drive 212 is coupled to the mandrel 264 to drive extension of the mandrel 264 and secure the door 218 of the process chamber 216. In one embodiment, the linear drive 212 includes a motor and lead screw with indexer which are configured to drive movement of the mandrel 264. The process chamber 216 may include more than one mandrel 264 to parallel process disks 260 (e.g., fifty disks can be processed at a given time, twenty-five on each mandrel in the chamber 216). The process chamber may further include one mandrel holding more than twenty five disks.

The transfer of the disks 260 from the entrance 304 of the tool 200 to the process chamber 216 will now be described in further detail with reference FIGS. 4A-4D. In particular, FIGS. 4A-4D illustrate transfer of the cassette and lifting of the cassette to the chamber 216 using the cassette conveyor 208 and disk lift 210. The cassette conveyor lift may lift more than one cassette. FIG. 4A illustrates the linear transfer of the cassette 256 on the cassette conveyor 208 and lifting of a cassette 256 to the level of the process chamber 206. The mandrel 264 is then extended via the mandrel linear drive 212 as shown in FIG. 4B to transfer the disks 260 from the cassette 256 onto the mandrel 264. As shown in FIG. 4C, after the disks 260 have been transferred to the mandrel 264, the cassette 256 is dropped back down to the cassette conveyor 208. The linear drive 212 then moves the mandrel 264 into the chamber to a position whereby the door 218 to the chamber 216 is closed as shown in FIG. 4D.

Figure 5:
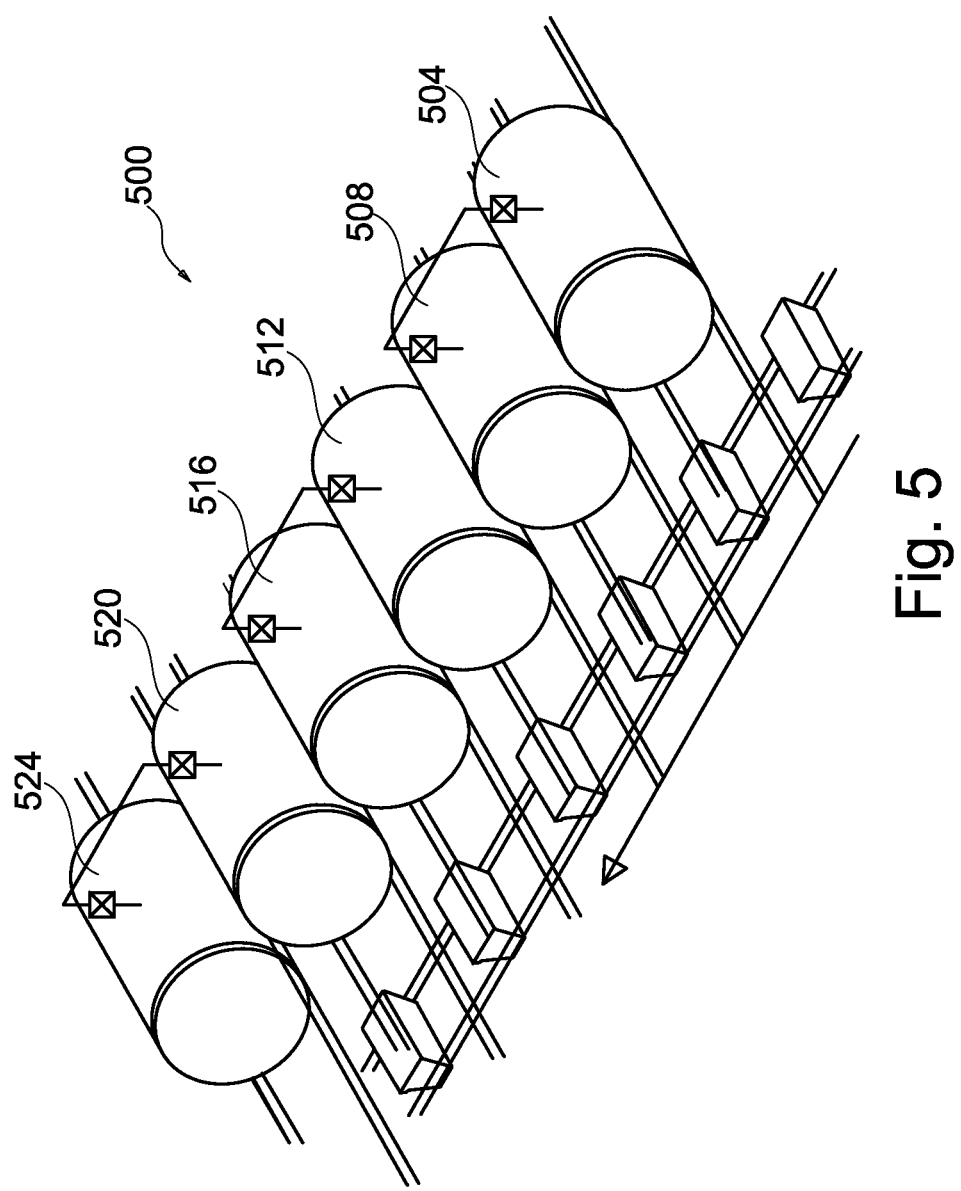
FIG. 5 illustrates a system having multiple chambers according to one embodiment of the invention.

The system may be scaleable for an even higher throughput manufacturing scale system. For example, multiple sub-systems (and/or nano-lithography priming tools) may be linked linearly to parallel process multiple cassettes of disks for higher throughput. FIG. 5 illustrates multiple modules 500 connected to one another for nanolithography processing including first and second chemical vapor deposition (e.g., water vapor) chambers 504, 508, third and fourth chemical vapor deposition (e.g., VALMAT vapor) chambers 512, 516, and first and second preparation (e.g., plasma etch or $O_2$-UV) chambers 520, 524. In FIG. 5, the disks 260 are transported from the preparation chambers 520, 524, to the third and fourth deposition chambers 516, 518, and then to the first and second deposition chambers 504, 508. The system illustrated in FIG. 5 is configured to process 50 disks per process (25 disks/chamber and 2 chambers/process). It will be appreciated that additional modules 500 may be provided to process additional disks as needed. Another example is disks from multiple cassettes can be transferred by one mandrel into the process chamber (see, e.g., FIGS. 12A-12C).

In another, multiple mandrels 264 may be mounted on the disk transfer mechanisms and positionable in a larger chamber for simultaneous processing of multiple cassettes of disks (see FIGS. 6A-7C). As shown in FIGS. 6A-D, the chamber 216 is configured to hold two mandrels 264 and the door 218 is moved downward when the disks 260 are loaded on the mandrels 264. As shown in FIG. 6A, the cassettes 256 are transferred to the chamber 216 on the cassette transfer 208. The cassettes 256 are then lifted using the disk lift 208 as shown in FIG. 6B, and the disks are transferred to the mandrel 264 (FIG. 6C). After the disks 260 are transferred to the mandrel 264, the cassette 256 is dropped back to the linear transfer 208 as shown in FIG. 6D. After all of the disks 260 have been loaded onto the mandrel 264 (see FIG. 7A), the mandrel(s) 264 are retracted into the chamber 216 using the linear drive 212 (see FIG. 7B) and the gate is closed (see FIG. 7C).

With reference back to FIGS. 2A-2F, the process chamber 216 provides a reaction environment that forms a surface modifying layer of bi-functional single molecules, in close-packed, oriented fashion on a first surface of the disks, so as to effect a change in the disk surface characteristics from that of a metal oxide-hydroxide in nature, to one that is organic in nature, and further allows the second surface to be cross-linkable to a polymeric imprinting resist upon UV irradiation. In one particular embodiment, the process chamber 216 may be, for example, a polycarbonate chamber having an internal volume of about, for example, 11 Litres.

Various features provide proper mechanisms and control thereof to allow sequential preparation of the disk surface by first performing a steady flow surface cleaning with ozone gas. The reactants in liquid form may be precision-metered for flow into a vaporizer (or a liquid-vapor phase separator). The vapor that exits the vaporizer may flow into the evacuated chamber sequentially or simultaneously. The vapor paths of the reactants may be arranged so that the reactants do not intermix until they enter the reaction chamber. The surface reaction that is induced when the reactants are in the chamber allows the primary functional group of the first reactant (e.g., ValMat) to bond to the surface of the disk via a hydrolysis-polycondensation reaction with the second reactant (e.g., water vapor), both in vapor form. The vaporizer may be used to prevent liquid mist or droplets from entering the processor 216. The process chamber 216 and the vapor feed line 224 may also be heated to maintain vapor temperature and prevent condensation of the vapor. The chamber 216 may include an auxiliary gas line (N2) to allow for active pressure control. The nanoimprint tool 200 may be arranged so that ozone is not allowed to intermix with the reactants outside of the reaction chamber.

The process chamber 216 may be configured to operate as a dual-mode vacuum system that allows for in-situ surface cleaning prior to deposition of the primer layer. In particular, the vacuum pump 220 may be coupled to the process chamber 216 to allow the process chamber 216 to operate in the two modes: (1) a continuous flow, sub-atmosphere pressure regime for ozone cleaning of primary surface, and (2) a low pressure, closed system dual-reactant chemical vapor deposition. In one embodiment, the first pressure regime may be in a near-atmospheric evacuated regime (e.g., about 100-760 Torr), and the second pressure regime may be in a higher vacuum state (e.g., about 10-1000 mTorr). The dual-mode operation is advantageous for particle reduction and for preserving pristine surfaces after an ozone cleaning step, without the impact of breaking vacuum, environmental contamination and moisture condensation on surfaces for ex situ cleaning. In particular, in the first pressure regime (e.g., about 100-760 Torr), the disks are processes under steady flow conditions, with an ozone generator flowing through the batch of disks to oxidatively remove surface contaminants and partially oxidize the metal surfaces in preparation for the next process step. The reactor is the evacuated to second pressure regime (e.g., about 10-200 mTorr) and subsequently sealed off. The reactants are either sequentially or simultaneously flowed into the chamber to reach a pre-determined pressure below 1000 mTorr. The disks are held under this condition until after the reactants react on the surface of the disks, completing the disk treatment in the chamber 216.

In one particular embodiment, 150 uL of ValMat is provided in a first supply reservoir and 100 uL of DI water is supplied in a second supply reservoir, which are placed in a water bath maintained at 95-120° C. The chamber 216 is then evacuated to about 23 Torr, the pump is isolated, the ValMat supply valve is opened for about 1 minute, and the system is allowed to stabilize for about 1 to 9 minutes. After stabilization, the DI water supply reservoir is opened for about 0.1 to 1 minute and the system is allowed to stabilize for about 0.1 to 9 minutes. Then, the system is vented to atmosphere. Optionally, an O2 plasma/O2-UV surface treatment/activation may be performed. The substrate is then evacuated/ozone treated to render the surface devoid of absorbents. The ValMat material is introduced in the vapor phase for "physi-sorption" on substrate surfaces. Water vapor is then introduced into the chamber. The surface reaction (hydrolysis-polycondensation) is allowed to proceed for about <10 minutes, causing hydrolysis of the ValMat material and poly-condensation bonding to the metal-oxide rich substrate surface. At this point, the primer treatment of the surface is complete and the substrate is ready for the remaining NIL processing. It will be appreciated that the substrate may undergo additional processing. For example, the substrate may undergo surface conditioning prior to physi-sorption of ValMat and H2O (e.g., 20 min of ambient O2 with ~500 watt UV light exposure, plasma etch with O2, O2 with UV but with controlled O2 partial pressure and higher UV power and UV uniformity, etc.).

Figure 8:
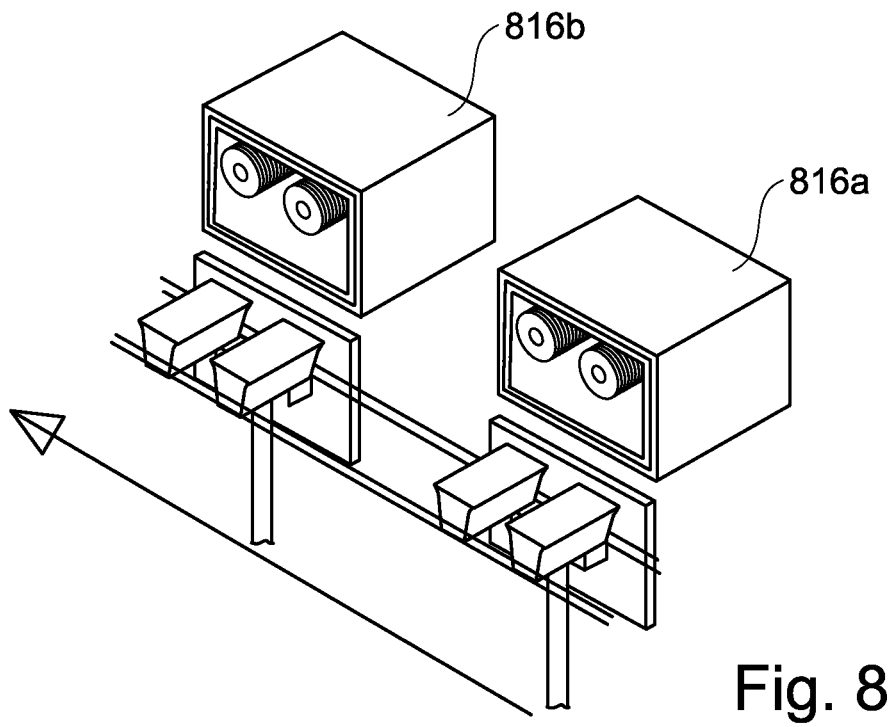
FIG. 8 is a perspective view of a nanolithography priming system illustrate separate process chambers for processing of the disks according to one embodiment of the invention.

In one embodiment, the chamber 216 may be arranged sequentially in accordance with the reaction sequence (e.g., a first chemical vapor deposition chamber 816a and a second chemical vapor deposition 816b) as shown in FIG. 8. In FIG. 8, the first chemical vapor deposition chamber 816a is configured for deposition of a first reactant (e.g., ValMat vapor) and the second chemical vapor deposition chamber 816b is configured for deposition of a second reactant (e.g., water vapor).

Figure 9:
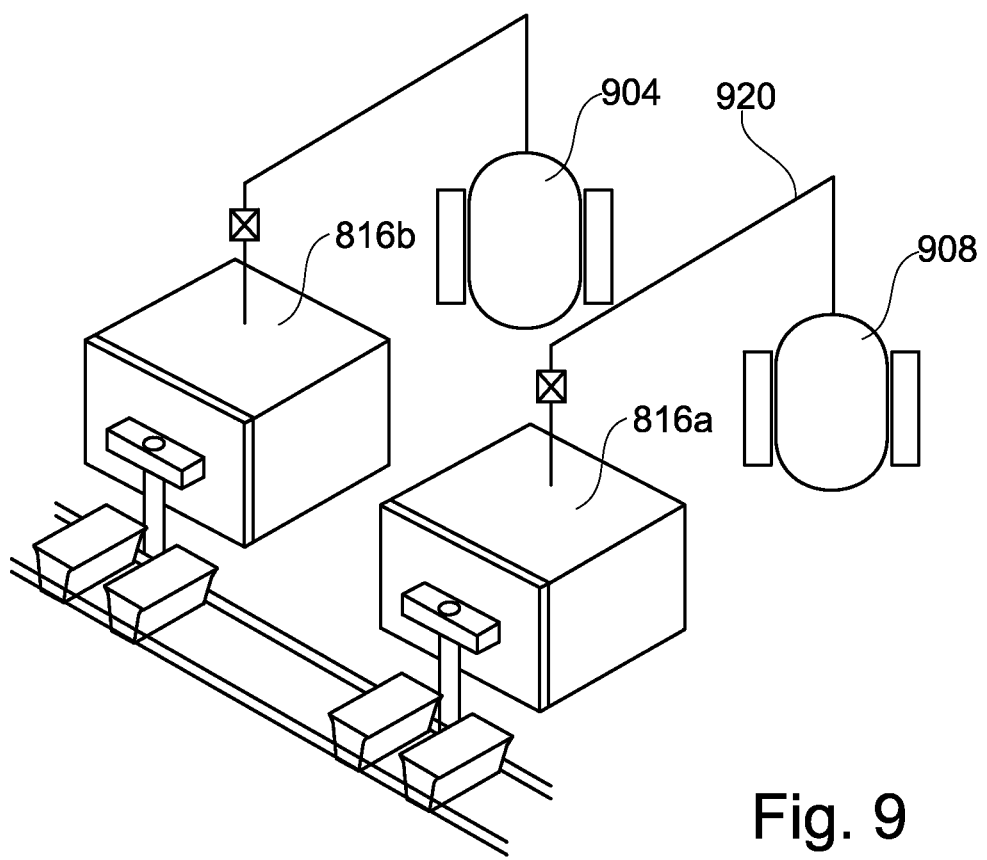
FIG. 9 is a perspective view of a nanolithography priming system illustrating a reservoir system for the nanolithography system according to one embodiment of the invention.

FIG. 9 illustrates a first reactant (e.g., water) holding reservoir 904 and a second reactant (e.g., ValMat) holding reservoir 908 that may be used with the configuration illustrated in FIG. 9. The second reactant holding reservoir 908 may connected to the deposition chamber 916a through a heated vapor transport line 920. The chambers 916a, 916b may include a timed release valve. According to one embodiment, the tandem reactor 916 allows for two sets of disks 260 to be parallel processed in the chamber 916. The reservoirs 904, 908 may be maintained at a constant temperature to allow equilibrium vapor pressure in storage at the beginning of each reaction cycle. In one embodiment, the volume of reservoirs 904, 908 is less than the volume of the reactor. The temperature of the reservoirs 904, 908 may be less than about 100° C. The chamber 216 may include a vapor release valve to control timing and dosage of the vapor going into chamber 216. In one particular embodiment, the valve has a timing accuracy of about 0.1 sec and a timing length of about 30 min.

Figure 10:
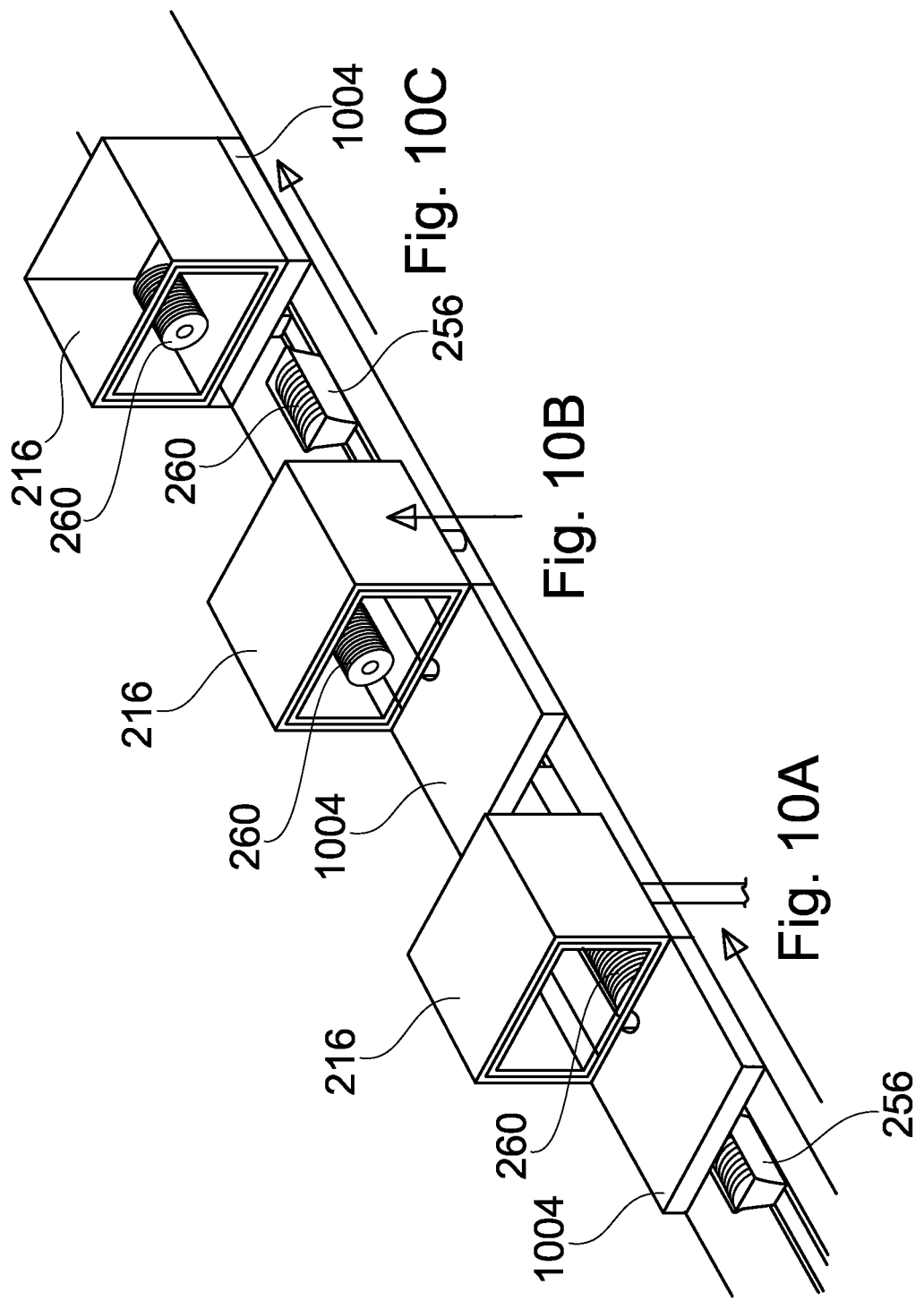
FIGS. 10A-10C illustrate disk transfer to a chamber according to one embodiment of the invention.

FIG. 10A-10C illustrate an alternative embodiment for transporting disks in-line for processing. In the embodiment shown in FIGS. 10A-C, the disks 260 are lifted through a bottom surface 1004 of the chamber 216, which is a movable gate. The mandrel 264 is lifted up and down from the cassette transfer 208 to transfer the disks 260 from the cassette 256 into the chamber 216. In particular, the cassette 256 is transferred to the chamber 216 (FIG. 10A), the mandrel 264 is lifted up into the chamber 216 (FIG. 10B) and the isolation gate 1004 closes to seal the chamber 216 (FIG. 10C), so that processing of the disks 260 can begin.

Figure 11:
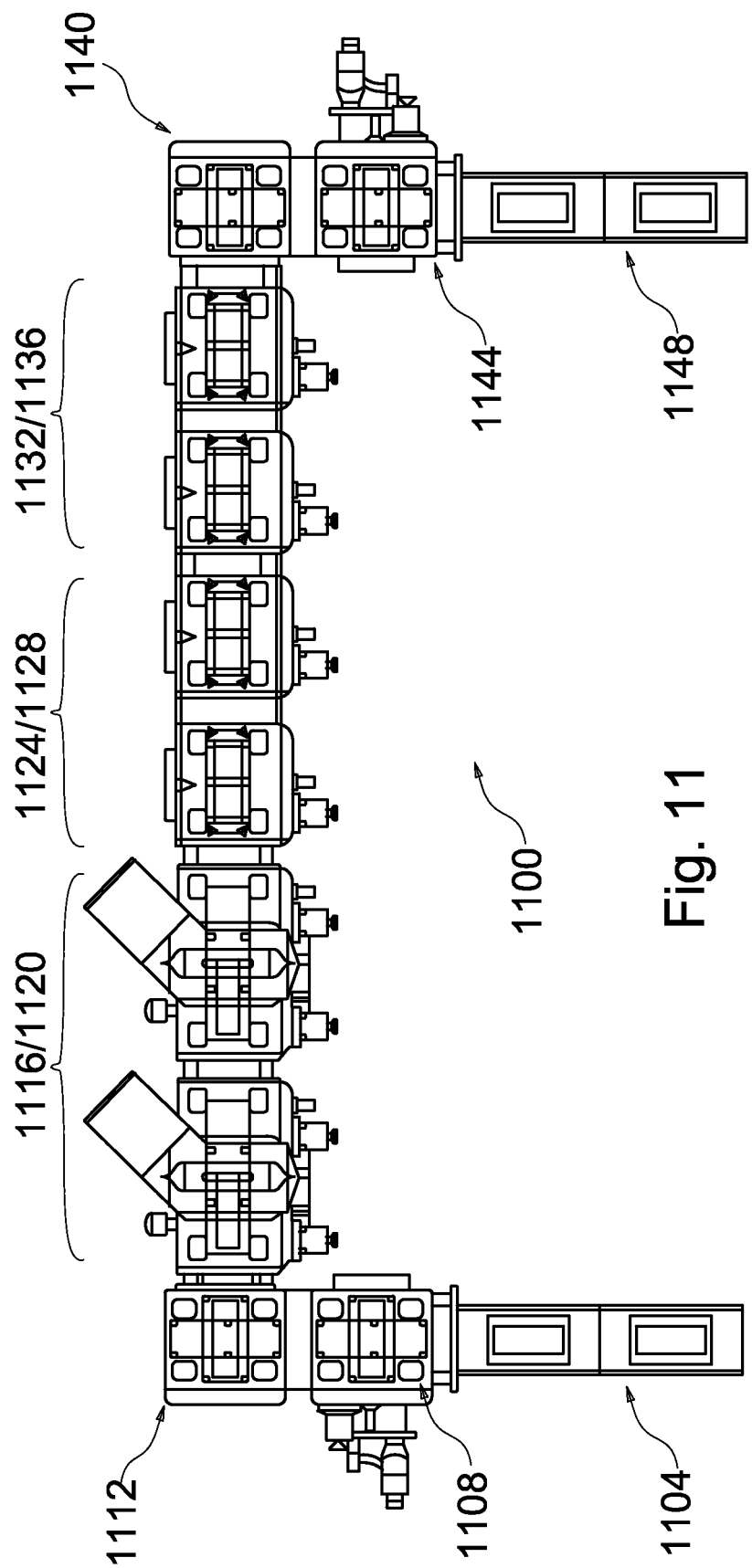
FIG. 11 illustrates a system for fabricating HDD patterned media disks according to one embodiment of the invention.

FIG. 11 illustrates a linearly aligned system 1100 that allows for batch processing of disks. The system 1100 includes a conveyor load 1104, a load lock 1108, a turn table 1112, two oxygen/ozone soft etch stations 1116, 1120, two first reactant (e.g., ValMat) process stations 1124, 1128, two second reactant (e.g., water) process stations 1132, 1136, a second turn table 1140, an unload lock 1144 and a conveyor load 1148.

Figure 12B:
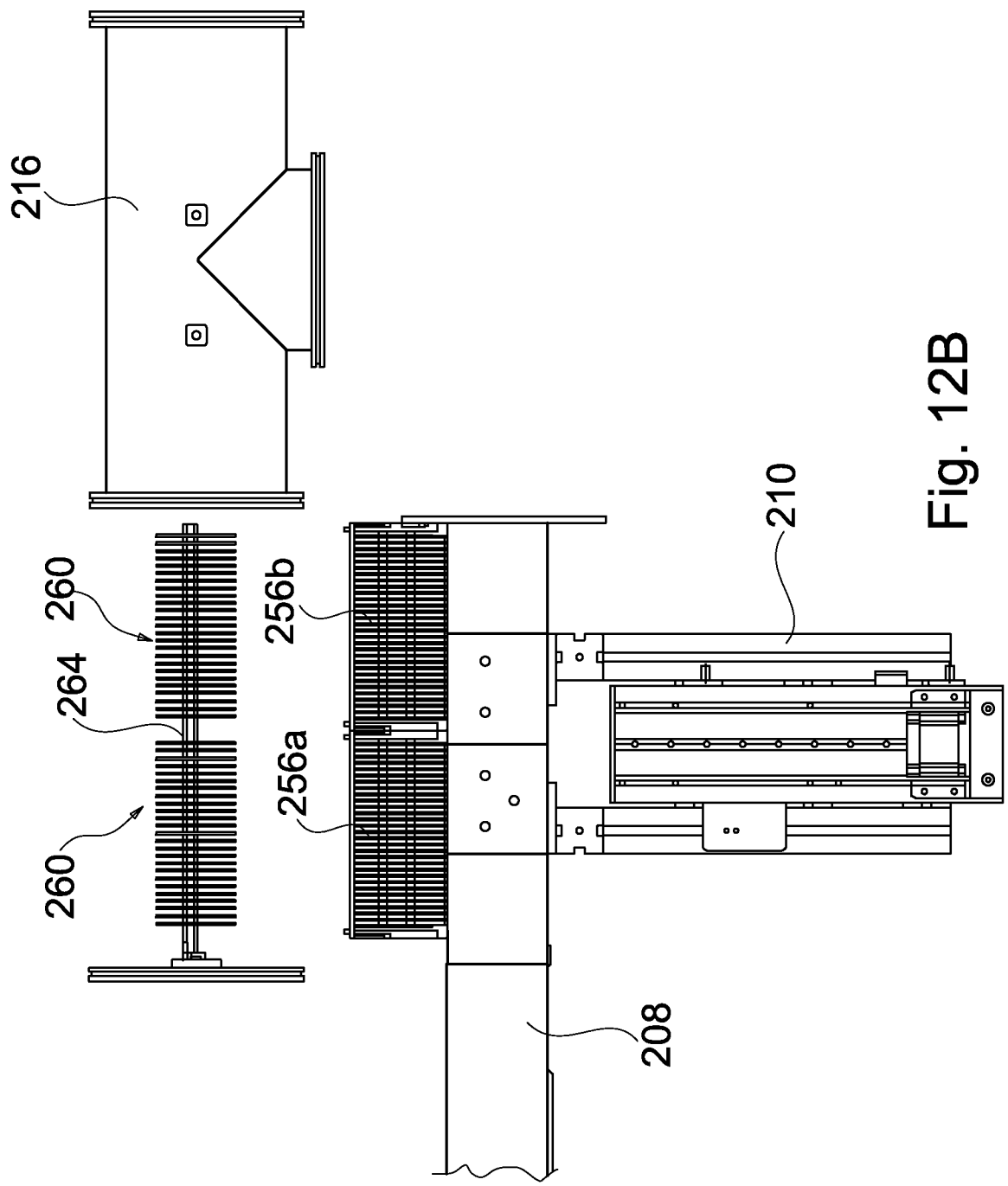
Figure 12C:
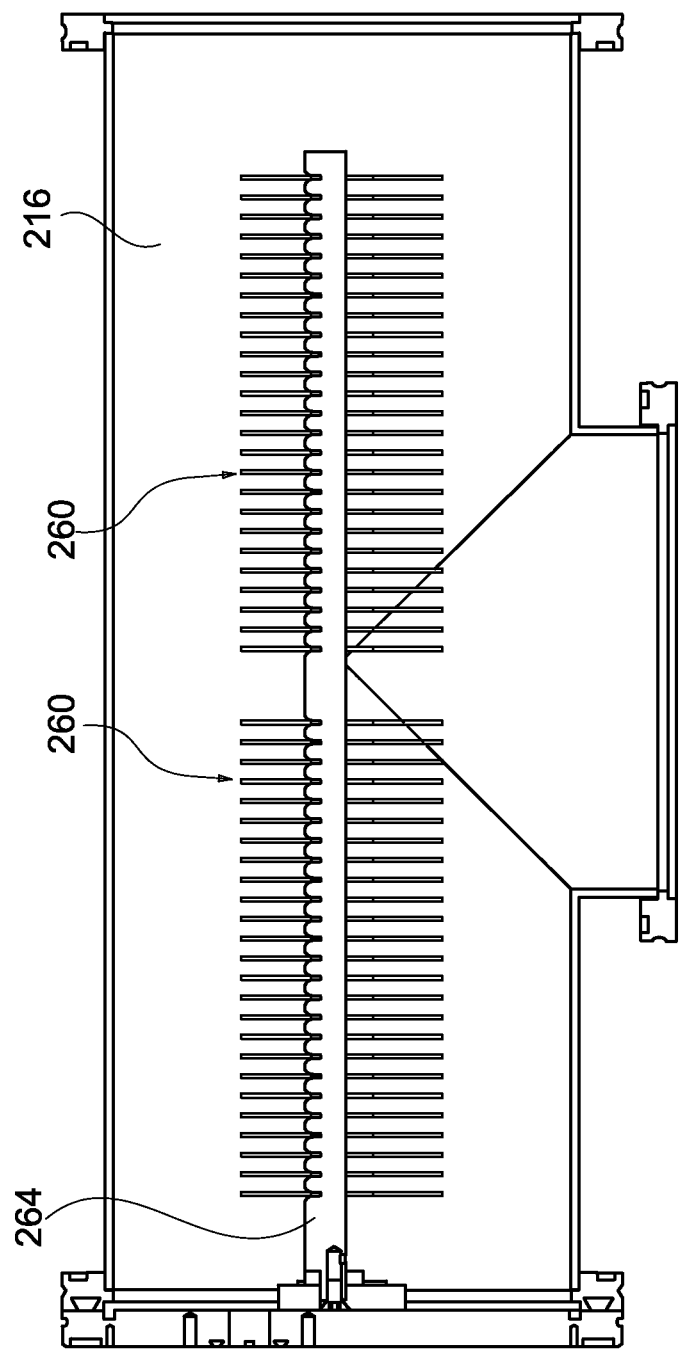

FIGS. 12A-12C illustrate an embodiment in which the nanoimprint priming tool 200 allows for multiple cassettes 256 to be transferred by one mandrel 264 into the process chamber 216. As shown in FIG. 12A, the cassettes 256 are lifted by the disk lift 210 to a loading level that allows the disks 260 in the cassettes 256 to be transferred into the process chamber 216. In FIG. 12A, two cassettes 256a, 256b are shown being lifted to the loading level. It will be appreciated that any number of cassettes may be lifted to allow for processing of multiple disks. As shown in FIG. 12B, the cassettes 256 are then lowered to the level of the cassette conveyor 208, the disks 260 remaining on the mandrel 264 for transfer into the process chamber 216. FIG. 12C illustrates the disks 260 in the chamber 216 on the mandrel 264.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A method comprising:
   transporting a plurality of hard disks in a cassette;
   transferring the plurality of hard disks from the cassette to a mandrel; and
   transferring the mandrel with the plurality of hard disks into a process chamber;
   depositing a first reactant on the plurality of hard disks;
   depositing a second reactant on the plurality of hard disks;
   operating the process chamber at a first pressure regime to clean the plurality of hard disks before deposition of the first and second reactants; and
   operating the process chamber at a second pressure regime during the deposition of the first and second reactants,
   wherein the first pressure regime is different than the second pressure regime.

2. The method of claim 1 further comprising:
   transporting a plurality of hard disks in multiple cassettes;
   transferring the plurality of hard disks from multiple cassettes to the mandrel; and
   transferring the mandrel with the plurality of hard disks into a process chamber.

3. The method of claim 1, wherein the mandrel is coupled to a door, and wherein transferring the mandrel further comprises sealing the door to the process chamber.

4. The method of claim 3, further comprising cleaning the disks by flowing ozone a low, steady flow into the processing chamber.

5. The method of claim 4, wherein the chamber is maintained at 100-760 Torr.

6. The method of claim 4, further comprising stopping the ozone flow and generating high vacuum condition inside the chamber and thereafter flowing a first reactant into the chamber.

7. The method of claim 6, wherein the high vacuum is maintained at 10-1000 mTorr.

8. The method of claim 6, wherein the second reactant comprises water vapor.

9. The method of claim 8, further comprising heating the process chamber to prevent condensation.

10. The method of claim 9, further comprising heating delivery pipes of the first and second reactants.

11. The method of claim 6, further comprising flowing nitrogen into the process chamber to control pressure inside the process chamber.

12. The method of claim 10, further comprising exposing the disks to UV light after reaction of first and second reactant is completed.

13. The method of claim 12, further comprising flowing O2 into the chamber during UV light exposure.

14. The method of claim 10, further comprising exposing the disks to plasma etch after reaction of first and second reactant is completed.

* * * * *